United States Patent
Majima et al.

(10) Patent No.: US 12,252,766 B2
(45) Date of Patent: Mar. 18, 2025

(54) COMPOSITE MATERIAL, HEAT SINK AND SEMICONDUCTOR DEVICE

(71) Applicants: SUMITOMO ELECTRIC INDUSTRIES, LTD., Osaka (JP); A.L.M.T. Corp., Tokyo (JP)

(72) Inventors: Masatoshi Majima, Osaka (JP); Gouhei Toyoshima, Yamagata (JP); Kouichi Takashima, Yamagata (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 246 days.

(21) Appl. No.: 17/917,006

(22) PCT Filed: Mar. 3, 2021

(86) PCT No.: PCT/JP2021/008039
§ 371 (c)(1),
(2) Date: Oct. 5, 2022

(87) PCT Pub. No.: WO2021/205782
PCT Pub. Date: Oct. 14, 2021

(65) Prior Publication Data
US 2023/0167528 A1    Jun. 1, 2023

(30) Foreign Application Priority Data
Apr. 9, 2020  (JP) ................. 2020-070227

(51) Int. Cl.
*C22C 26/00*   (2006.01)
*C25D 3/12*    (2006.01)
(Continued)

(52) U.S. Cl.
CPC ............. *C22C 26/00* (2013.01); *C25D 3/12* (2013.01); *C25D 7/00* (2013.01); *H01L 23/3732* (2013.01)

(58) Field of Classification Search
None
See application file for complete search history.

(56) References Cited

U.S. PATENT DOCUMENTS

| | | | |
|---|---|---|---|
| 5,045,972 A | 9/1991 | Supan et al. | |
| 5,120,495 A | 6/1992 | Supan et al. | |
| 2020/0370146 A1 | 11/2020 | Matsugi et al. | |

FOREIGN PATENT DOCUMENTS

| | | | |
|---|---|---|---|
| CN | 101985702 A | 3/2011 | |
| CN | 102108458 A * | 6/2011 | ............... C22C 1/10 |

(Continued)

OTHER PUBLICATIONS

Nishida—JP 2004-197153 A—IDS—MT—coated diamond-copper matrix—2004 (Year: 2004).*

(Continued)

*Primary Examiner* — John Vincent Lawler
(74) *Attorney, Agent, or Firm* — Renner, Otto, Boisselle & Sklar, LLP (57) ABSTRACT

A composite material of the present disclosure contains a plurality of diamond particles, copper, and at least one first element selected from the group consisting of silicon, chromium, cobalt, nickel, molybdenum, titanium, vanadium, niobium, tantalum tungsten and aluminum, wherein the content rate of the first element based on the total mass of the copper and the first element is 50 ppm or higher and 2,000 ppm or lower.

6 Claims, 2 Drawing Sheets

(51) Int. Cl.
 *C25D 7/00* (2006.01)
 *H01L 23/373* (2006.01)

(56) References Cited

FOREIGN PATENT DOCUMENTS

| CN | 104625077 A | * | 5/2015 | ............... B22F 1/02 |
| CN | 106854750 A | * | 6/2017 | ............... B22F 1/17 |
| CN | 110496962 A | | 11/2019 | |
| JP | H104-259305 A | | 9/1992 | |
| JP | 2003-309316 A1 | | 10/2003 | |
| JP | 2004197153 A | * | 7/2004 | ............... B22F 3/02 |
| JP | 2017075397 A | * | 4/2017 | ............... B22F 1/00 |
| WO | 2019/163721 A | | 8/2019 | |

OTHER PUBLICATIONS

Yongzheng—CN 102108458 A—MT—coated diamond copper composite—2011 (Year: 2011).*
Hutsch—Conduct.Cu-diamond composites w-Cr—Euro D1—2016 (Year: 2016).*
Fukui—JP 2017-075397 A—Euro D3—MT—heat spreader—2017 (Year: 2017).*
Xu—CN 106854750 B—IDS—MT—diamond-copper w-carbide coating—2017 (Year: 2017).*
PTable.com—Periodic Table—Nov. 20, 2023 (Year: 2023).*
RoySocChem—Chromium—Element information, properties and uses—Aug. 7, 2024 (Year: 2024).*
RoySocChem—Copper—Element information, properties and uses—Aug. 7, 2024 (Year: 2024).*
RoySocChem—Titanium—Element information, properties and uses—Aug. 8, 2024 (Year: 2024).*
Mankowski—copper-diamond w-chromium—J.Therm.Calorim—2014 (Year: 2014).*
Liu—CN 104625077 A—MT—coated diamond-copper composite—2015 (Year: 2015).*
Hutsch, Thomas et al. "Thermal conductivity of PM Cu/Diamond composites depending on the chromium content—prediction and characterization", European Congress and Exhibition on Powder Metallurgy, Oct. 13, 2016, pp. 1-7.
Yang, Lin et al. "Thermal conductivity of Cu—Ti/diamond composites via spark plasma sintering", Diamond and Related Materials, Feb. 19, 2019 pp. 37-42.

* cited by examiner

COMPOSITE MATERIAL, HEAT SINK AND SEMICONDUCTOR DEVICE

TECHNICAL FIELD

The present invention relates to a composite material, a heat sink and a semiconductor device. The present application claims priority based on Japanese Patent Application No. 2020-070227, filed on Apr. 9, 2020, the entire contents of which are incorporated herein by reference.

BACKGROUND ART

In recent years, higher thermal conductivities have been demanded for heat sinks along with output enhancement and integration enhancement of semiconductor devices. As one of materials of heat sinks, copper (Cu) having a high thermal conductivity has been used. However, copper, while having a high thermal conductivity, has a large thermal expansion coefficient as compared with typical semiconductors, Si, InP and GaAs. Hence, when copper and a semiconductor element are joined, a large thermal stress is generated near the jointed interface in a cooling process from a heating temperature to room temperature during joining work, or along with the heat cycle during usage, and therefore copper cannot be used in some cases.

Then, there have been used materials such as CuW and CuMo having thermal expansion coefficients closer to those of the semiconductors, obtained by alloying copper with materials having low thermal expansion coefficient such as tungsten and molybdenum. However, the materials other than copper have a low thermal conductivity, and accordingly the thermal conductivities of these alloys also lower.

A material capable of making a high-thermal conductivity heat sink includes diamond. Diamond has a high thermal conductivity of 1,000 W/mK or higher. Diamond, however, has too low thermal expansion coefficient to be suitable to semiconductor elements having a relatively high thermal expansion coefficient, such as GaAs. Further, since the Young's modulus of diamond is as very high as 1,050 GPa, a large thermal stress is generated near the interface between the heat sink and the semiconductor element in a cooling process during brazing to a semiconductor element or in the heat cycle during usage, and therefore diamond cannot be used in some cases.

Then, as a material of heat sinks, a material (hereinafter, described also as a "composite material") made by compositing diamond and a metal has been developed. A method of compositing diamond and a metal includes an infiltration process and a high-temperature superhigh-pressure sintering process.

The infiltration process is a process in which a mixed powder of diamond particles and a metal powder is melted and solidified under pressurizing of the mixed powder, to composite the diamond particles and the metal.

Japanese Patent Laying-Open No. 2004-197153 (PTL 1) discloses, as a composite material obtained by an infiltration process, a diamond-metal composite material, which contains diamond particles, a reaction layer having, as a main component, a carbide of a metal 2 composed of one or more selected from Group 4a, 5a and 6a elements, formed on a surface of each diamond particle, and a metal 1 composed of one or more selected from Ag, Cu, Au, Al, Mg and Zn, wherein each diamond particle having the reaction layer is separated from each other by the metal 1 and dispersed in a matrix formed of the metal 1.

The high-temperature superhigh-pressure sintering process is a process of sintering a mixed powder of diamond particles and a metal powder under a high-temperature superhigh-pressure condition to composite the diamond particles and the metal.

Japanese Patent Laying-Open No. 2003-309316 (PTL 2) discloses, as a composite material obtained by a high-temperature superhigh-pressure sintering process, a sintered material composed of diamond particles as a main component and copper substantially as the rest.

CITATION LIST

Patent Literature

PTL 1: Japanese Patent Laying-Open No. 2004-197153
PTL 2: Japanese Patent Laying-Open No. 2003-309316

SUMMARY OF INVENTION

A composite material of the present disclosure is a composite material, comprising:
 a plurality of diamond particles;
 copper; and
 at least one first element selected from the group consisting of silicon, chromium, cobalt, nickel, molybdenum, titanium, vanadium, niobium, tantalum, tungsten and aluminum,
 wherein the content rate of the first element based on the total mass of the copper and the first element is 50 ppm or higher and 2,000 ppm or lower.

A heat sink of the present disclosure is a heat sink comprising:
 the above composite material; and
 a metal plating layer provided on at least a part of the surface of the composite material.

A semiconductor device of the present disclosure is a semiconductor device, comprising:
 the above heat sink.

DETAILED DESCRIPTION

Problem to be Solved by the Present Disclosure

The composite material of PTL 1 has a structure in which the content proportion of Group 4 elements, Group 5 elements and Group 6 elements based on the total amount of a metal matrix and the Group 4 elements, Group 5 elements and Group 6 elements is about 1% to 30% in terms of mass, and diamond and copper are tightly adhered through a carbide of the Group 4 elements, Group 5 elements and Group 6 elements. However, the Group 4 elements, Group 5 elements and Group 6 elements, which have lower thermal conductivity than copper, causes lowering of the thermal conductivity of the composite material. Thus, the improvement of the thermal conductivity of the composite material is desired.

The composite material of PTL 2 contains no Group 4 elements, Group 5 elements or Group 6 elements, which cause lowering of the thermal conductivity, and is therefore unlikely to suffer from lowering of the thermal conductivity caused by these elements. On the other hand, in the case where the composite material of PTL 2 is joined with a semiconductor element, in order to raise the joining strength of the both, a metal plating treatment is carried out on the composite material in many cases. When as the metal plating treatment, for example, a nickel electroplating treatment is carried out, the thermal conductivity and the strength of the composite material after the plating treatment are likely to lower.

Then, the present object is to provide a composite material having a high thermal conductivity and a high strength, in particular, also after the nickel electroplating treatment, and a heat sink and a semiconductor device using the composite material.

Advantageous Effects of the Present Disclosure

The composite material of the present disclosure can have a high thermal conductivity and a high strength, in particular, also after a nickel electroplating treatment.

The heat sink of the present disclosure can have a high thermal conductivity and a high strength.

The semiconductor device of the present disclosure can maintain an excellent performance and simultaneously can have a long service life.

DESCRIPTION OF EMBODIMENTS

First, embodiments of the present disclosure will be listed and described.

(1) A composite material of the present disclosure is a composite material comprising:
  a plurality of diamond particles;
  copper; and
  at least one first element selected from the group consisting of silicon, chromium, cobalt, nickel, molybdenum, titanium, vanadium, niobium, tantalum, tungsten and aluminum
  wherein the content rate of the first element based on the total mass of the copper and the first element is 50 ppm or higher and 2,000 ppm or lower.

The composite material of the present disclosure can have a high thermal conductivity and a high strength, in particular, also after a nickel electroplating treatment.

(2) It is preferable that the composite material comprises 60% by volume or higher and 90% by volume or lower of the diamond particles and 10% by volume or higher and 40% by volume or lower of the copper. According to this, the thermal conductivity of the composite material becomes further high. Further, the difference in thermal expansion coefficient between the composite material and a semiconductor element can be made small.

(3) It is preferable that the content rate of the first element based on the total mass of the copper and the first element is 200 ppm or higher and 800 ppm or lower. According to this, the thermal conductivity and the strength of the composite material become further high.

(4) It is preferable that the first element is concentrated at interfaces between the diamond particles and the copper. According to this, the strength of the composite material becomes further high.

(5) The heat sink of the present disclosure is a heat sink, comprising:
  the above-mentioned composite material; and
  a metal plating layer provided on at least a part of the surface of the composite material.

The heat sink of the present disclosure can have a high thermal conductivity and a high strength.

(6) The semiconductor device of the present disclosure is a semiconductor device, comprising: the above-mentioned heat sink.

The semiconductor device of the present disclosure can maintain an excellent performance and simultaneously can have a long service life.

DETAILS OF THE EMBODIMENTS OF THE PRESENT DISCLOSURE

In the case where a nickel electroplating treatment is carried out on a conventional composite material fabricated by a high-temperature superhigh-pressure sintering process, there lower the thermal conductivity and the strength of the composite material after the nickel electroplating treatment; the present inventors have studied the cause of the lowering.

First, the relation between the time of the nickel electroplating treatment and the thermal conductivity was examined. From this result, it was confirmed that the longer the treatment time, the thermal conductivity is likely to lower.

Further, a composite material after the nickel electroplating treatment is sheared and the sheared face was observed; then, the peripheral potion was discolored and there was detected in the discolored portion, chlorine (Cl) being a constituent of a WATT bath (containing nickel sulfate, nickel chloride and boric acid).

The present inventors, based on the above finding, inferred, as follows, the cause of lowering the thermal conductivity and the strength of the composite material during the nickel electroplating treatment.

During a nickel electroplating treatment of a conventional composite material, a nickel electroplating solution penetrates in gaps of interfaces between diamond particles and copper in the composite material. Part of the copper present in the region of the interfaces is dissolved in the nickel electroplating solution, progressing corrosion of the copper in the interface region.

It is inferred that along with the corrosion of the copper, the gaps of the interfaces between the diamond particles and the copper expand, lowering the thermal conductivity and the strength. Such corrosion of the copper is liable to be generated not only in the nickel electroplating treatment but also in other electroplating treatments.

As a result of exhaustive studies, the present inventors, based on the above inference, have newly created a composite material having a high thermal conductivity and a high strength, in particular, also after a nickel electroplating treatment.

Hereinafter, specific examples of the composite material, the heat sink and the semiconductor device of the present disclosure will be described below by reference to the drawings. In the drawings of the present disclosure, the same reference signs represent the same parts or equivalent parts. Then, the dimensional relation of length, width, thickness, depth and the like are suitably varied for clarification and simplification of the drawings, and do not always represent the actual dimensional relation.

In the present description, the representation in the style of "A to B" means the lower limit and the upper limit of a region (that is, A or more and B or less); and in the case where no unit is described for A and a unit is described only for B, the unit of A and the unit of B are the same.

Embodiment 1: A Composite Material

The composite material of the present disclosure is a composite material containing a plurality of diamond particles, copper, and at least one first element selected from the group consisting of silicon, chromium, cobalt, nickel, molybdenum, titanium, vanadium, niobium, tantalum, tungsten and aluminum, wherein the content rate of the first element based on the total mass of the copper and the first element is 50 ppm or higher and 2,000 ppm or lower.

The composite material of the present disclosure can have a high thermal conductivity and a high strength, in particular, also after a nickel electroplating treatment. The reason therefor is inferred as follows.

The composite material of the present disclosure contains at least one first element selected from the group consisting of silicon, chromium, cobalt, nickel, molybdenum, titanium, vanadium, niobium, tantalum, tungsten and aluminum. These first elements are higher in the corrosion resistance than copper. Therefore, in the composite material of the present disclosure, during the nickel electroplating treatment, the corrosion of copper is suppressed. It is hence inferred that the composite material of the present disclosure can have a high thermal conductivity and a high strength also after the nickel electroplating treatment.

(Diamond Particles)

The composite material of the present disclosure contains diamond particles. Thereby, the composite material of the present disclosure can have excellent thermal conductiveness.

It is preferable that the composite material contains 60% by volume or higher and 90% by volume or lower of diamond particles and 10% by volume or higher and 40% by volume or lower of copper. According to this, the thermal conductivity of the composite material becomes further high. Further, the difference in thermal expansion coefficient between the composite material and a semiconductor element can be made small.

The lower limit of the content rate of the diamond particles in the composite material is, from the viewpoint of improving the thermal conductivity, preferably 60% by volume or higher and more preferably 70% by volume or higher. The upper limit of the content rate of the diamond particles in the composite material is, from the viewpoint of making small the difference in thermal expansion coefficient between the composite material and a semiconductor element, preferably 90% by volume or lower. The content rate of the diamond particles in the composite material is preferably 60% by volume or higher and 90% by volume or lower and more preferably 70% by volume or higher and 90% by volume or lower.

The content rate (% by volume) of the diamond particles in the composite material is measured by the following method. A sample having a smooth cross section is obtained by subjecting the hard metal to CP (Cross Section Polisher) work using argon ion beams or the like. By taking an image at a magnification of 200 times of the above cross section of the sample by using a scanning electron microscope (SEM), an electron microscopic image (SEM image) of the cross section of the above sample is obtained.

Then, a binarization processing using a threshold value which can recognize a diamond particle is carried out on the above electron microscopic image by using image analysis software to thereby obtain a binarized image. Based on the binarized image, there is calculated the ratio (areal ratio) of the sum of areas of the diamond particles to the area of the above whole binarized image. The areal ratio is regarded as the content rate (% by volume) of the diamond particles in the composite material. In the present description, the "content rate (% by volume) of diamond particles in the composite material" is taken as an average value of each content rate of diamond particles obtained by preparing 10 sheets (10 view areas) of electron microscopic images so that there are no overlapping portions of the taken images, and averaging the content rates calculated in the 10 view areas.

Although the composite material contains at least one first element selected from the group consisting of silicon, chromium, cobalt, nickel, molybdenum, titanium, vanadium, niobium, tantalum, tungsten and aluminum, described below, since the content of the first element is minute to the copper, the volumetric proportion of the first element in the composite material can be regarded as 0.

The lower limit of the average particle diameter of the diamond particles is, from the viewpoint of reducing grain boundaries between the diamond particles or grain boundaries between the diamond particles and the copper and improving the thermal conductivity, preferably 3 μm or larger, more preferably 5 μm or larger and still more preferably 10 μm or larger. The upper limit of the average particle diameter of the diamond particles is, from the viewpoint of improving the workability of the composite material and attaining thickness reduction, preferably 100 μm or smaller, more preferably 80 μm or smaller and still more preferably 70 μm or smaller. The average particle diameter of the diamond particles is preferably 3 μm or larger and 100 μm or smaller, more preferably 5 μm or larger and 80 μm or smaller and still more preferably 10 μm or larger and 70 μm or smaller.

In the present description, the average particle diameter of the diamond particles is measured by the following method. By the same method as the above measuring method of the content rate (% by volume) of the diamond particles in the composite material, a binarized image is fabricated based on an electron microscopic image (SEM image) of a cross section of a sample. In the binarized image, the area of each diamond particle is determined; the diameter (equivalent circle diameter) of a circle having an area equal to the determined area is calculated; and their average is defined as an average particle diameter. In the present description, the "average particle diameter of diamond particles" is taken as an average value of average particle diameters of diamond particles obtained by preparing 10 sheets (10 view areas) of electron microscopic images so that there are no overlapping portions of the taken images, in the cross section of the sample, and averaging the particle diameters calculated in the 10 view areas.

(Copper)

The composite material of the present disclosure contains copper. Thereby, the composite material of the present disclosure can have excellent thermal conductiveness.

The lower limit of the content rate of copper in the composite material is, from the viewpoint of making small the difference in thermal expansion coefficient between the composite material and a semiconductor element, preferably 10% by volume or higher. The upper limit of the content rate of copper in the composite material is, from the viewpoint of improving the thermal conductivity, preferably 40% by volume or lower and more preferably 30% by volume or lower. The content rate of the copper in the composite material is preferably 10% by volume or higher and 40% by volume or lower and more preferably 10% by volume or higher and 30% by volume or lower.

The content rate (% by volume) of copper in the composite material is calculated by subtracting the content rate of the diamond particles from the whole composite material.

(First Element)

The composite material contains at least one first element selected from the group consisting of silicon, chromium, cobalt, nickel, molybdenum, titanium, vanadium, niobium, tantalum, tungsten and aluminum, and the content rate (hereinafter, referred to also as "content rate of the first element") of the first element based on the total mass of copper and the first element is 50 ppm or higher and 2,000 ppm or lower. According to this, the composite material can have a high thermal conductivity and a high strength also after a nickel electroplating treatment.

The content rate of the first element based on the total mass of the copper and the first element in the composite material is, from the viewpoint of improving the thermal conductivity and improving the strength, preferably 200 ppm or higher and 800 ppm or lower.

The content W1 in terms of mass of the copper in the composite material and the content W2 in terms of mass of the first element therein can be measured by analysis using ICP atomic emission spectrometry (instrument to be used: "ICPS-8100"(trade name), manufactured by Shimadzu Corp.). Specifically, 0.5 g of a sample of the composite material is dissolved in an acid solution in which 5 mL of a concentrated hydrochloric acid (36%) and 5 mL of a concentrated nitric acid (60%) are added to 10 mL of pure water, and thereafter, the solution was measured by ICP atomic emission spectrometry and masses of W1 and W2 are calculated. Based on the values of W1 and W2, the content rate of the first element based on the total mass of the copper and the first element can be obtained.

It is preferable that the first element is concentrated at the interface between the diamond particles and the copper. According to this, at the interface between the diamond particles and the copper, the effect of corrosion resistance by the first element is easily exhibited. Therefore, it is conceivable that during a nickel electroplating treatment, there is more effectively suppressed the corrosion of the copper in the region of the interfaces between the diamond particles and the copper by the nickel electroplating solution.

A method of confirming that the first element is concentrated at the interface between the diamond particles and the copper will be described below.

(1-1) A sample is taken from the composite material and is sliced into a thickness of 30 to 100 nm to fabricate a cut piece by using an ion slicer, "EM-09100IS"(trade name), manufactured by JEOL Ltd.

(1-2) The cut piece fabricated in the above (1-1) is observed by a transmission electron microscope (TEM, "JEM-2100F/Cs"(trade name), manufactured by JEOL Ltd.) at a magnification of 100,000 times; and element mapping analysis is carried out by using an energy dispersive X-ray spectroscopy (EDX, "EDAX"(trade name), manufactured by AMETEK Inc.) attached to the TEM to obtain an element mapping image. In the element mapping analysis, distributions of the first element, copper and carbon are analyzed.

Figure 1:
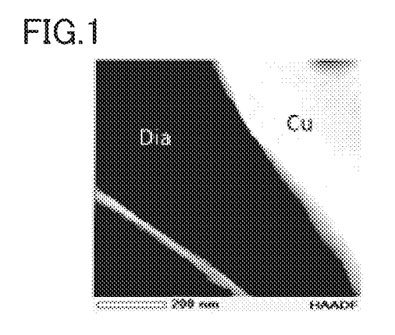
FIG. 1 is an image showing an example of a TEM image of a composite material of the present disclosure.
Figure 2:
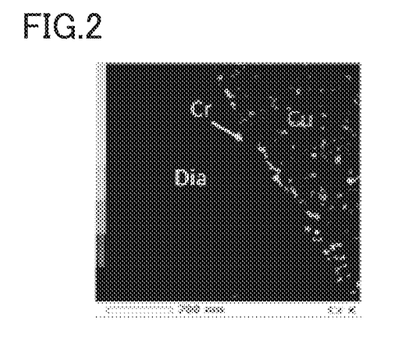
FIG. 2 is an image showing an element mapping image obtained by element mapping analysis of the image of FIG. 1.

An example of a TEM image of the composite material of the present disclosure is shown in FIG. 1, and an element mapping image obtained by element mapping analysis of the image of FIG. 1 is shown in FIG. 2. In FIG. 1, a darkfield area indicated as Dia indicates an area (hereinafter, referred to also as "diamond area") where a diamond particle is present; and a bright field area indicated as Cu indicates an area (hereinafter, referred to also as "copper area) where copper is present. In FIG. 2, portions indicated as bright field indicate a first element (Cr).

(1-3) Based on the TEM image obtained in the above (1-2), interfaces between diamond particles and copper are identified.

(1-4) The TEM image and the element mapping image obtained in the above (1-2) are superposed, and the element line analysis is carried out across from a diamond particle to copper in the direction perpendicular to the interface between the diamond particle and the copper to measure the content of the first element. Here, the direction perpendicular to the interface means the direction along a straight line crossing a tangent line in the extending direction of the interface at an angle of 90°±5°. The beam diameter of the element line analysis is made to be 0.3 nm or smaller and the scanning interval is made to be 0.1 to 0.7 nm.

(1-5) As a result of the measurement of the above (1-4), in the case where the concentration of the first element in the ranges where the distance from the interface is 1 nm or larger and 30 nm or smaller is higher by 50% or higher than the concentration of the first element in the diamond region and the copper region in the ranges where the distance from the interface is 40 nm or larger and 50 nm or smaller, it is confirmed that the first element is concentrated at the interface between the diamond particles and the copper.

Here, in the case where in the above confirmation, 10 samples of 10 portions arbitrarily selected from the composite material are fabricated and the condition of the above (1-5) is satisfied in one or more samples, it is judged that in the composite material, the first element is concentrated at the interface between the diamond particle and the copper.

(Characteristics of the Composite Material)

The thermal conductivity at room temperature (23° C.) of the composite material after a nickel electroplating treatment is preferably 400 W/mK or higher, more preferably 430 W/mK or higher and still more preferably 450 W/mK or higher. The thermal conductivity of the composite material is measured by a laser flash method. The measurement is carried out, for example, by a commercially available measuring instrument ("LFA467", manufactured by NETZSCH GmbH).

The composite material of the present disclosure, which contains diamond particles having a low thermal expansion coefficient and copper having a sufficiently high thermal expansion coefficient than that of diamond as main components, can have an intermediate value in thermal expansion coefficient of the both. For example, the average thermal expansion coefficient in the temperature range of 30° C. to 400° C. of the above composite material is preferably $3\times10^{-6}$/K or higher and $13\times10^{-6}$/K or lower, more preferably $4\times10^{-6}$/K or higher and $12\times10^{-6}$/K or lower and still more preferably $4.5\times10^{-6}$/K or higher and $10\times10^{-6}$/K or lower.

(The Shape and Size of the Composite Material)

A typical shape of the composite material of the present disclosure includes flat plate shapes. The composite material can be made as a desired planar shape or three-dimensional shape one according to a shape of a forming die used in the production, a cutting processing, or the like. The size (thickness, width, length and the like) of the composite material and the like can suitably be selected. When the thickness is small (for example, 5 mm or smaller, 3 mm or smaller, further, 2.5 mm or smaller), a light-weight thin composite material can be made.

(Method for producing the composite material)

A method for producing the composite material of the embodiment 1 can have, for example, a step (hereinafter, referred to also as "first mixed powder preparation step") of mixing a copper powder and a powder (hereinafter, referred to also as "first element powder") of at least one first element selected from the group consisting of silicon, chromium, cobalt, nickel, molybdenum, titanium, vanadium, niobium, tantalum, tungsten and aluminum, to thereby obtain a first mixed powder, a step (hereinafter, referred to also as "second mixed powder preparation step") of mixing the first mixed powder with a diamond powder to thereby obtain a second mixed powder, and a step (hereinafter, referred to also as "sintering step") of sintering the second mixed powder under a high-temperature superhigh-pressure condition to thereby obtain the composite material. The detail of each step will be described below.

(First Mixed Powder Preparation Step)

First, by mixing a copper powder and a powder of at least one first element selected from the group consisting of silicon, chromium, cobalt, nickel, molybdenum, titanium, vanadium, niobium, tantalum, tungsten and aluminum, a first mixed powder is obtained.

The size (average particle diameter) of the copper powder can suitably be selected, and includes, for example, about 1 μm or larger and 150 μm or smaller. When the size is in this range, it is conceivable that since the powder is not too small, the handling is easy and since not too large, the powder is easily melted in sintering.

The size (average particle diameter) of the first element powder can suitably be selected, and includes, for example, about 1 μm or larger and 150 μm or smaller. When the size is in this range, it is conceivable that since the powder is not too small, the handling is easy and since not too large, the powder is easily melted in sintering.

The content rate (in terms of mass) of the first element powder in the first mixed powder is selected so that the content rate (in terms of mass) of the first element in a composite material to be finally produced becomes a desired value. The content rate of the first element powder in the first mixed powder can be made to be, for example, 50 ppm or higher and 2,000 ppm or lower, or 200 ppm or higher and 800 ppm or lower.

The first element powder as a raw material having a higher purity is better in thermal conductiveness, which is preferable. The purity of each first element powder in the first element powder can be made to be, for example, 99.99% or higher.

The copper powder as a raw material having a higher purity is better in thermal conductiveness, which is preferable. The purity of the copper powder can be made to be, for example, 99.99% or higher.

(Second Mixed Powder Preparation Step)

Then, by mixing the first mixed powder and a diamond powder, a second mixed powder is obtained.

The size (average particle diameter) of the diamond powder is selected so as to become a size (average particle diameter) of diamond particles in a composite material to be finally produced. It is preferable that the average particle diameter of the diamond powder as a raw material is, for example, 1 μm or larger and 300 μm or smaller, 1 μm or larger and 100 μm or smaller, or 20 μm or larger and 60 μm or smaller.

The mixing proportion of the first mixed powder and the diamond powder is selected so that the volumetric proportions of the diamond particles and the copper in a composite material to be finally produced become desired values. Here, although the first element powder is contained in the first mixed powder, since the content is minute, the first element powder will not be taken into consideration as a volumetric proportion.

The diamond powder as a raw material having a higher purity (for example, natural diamond) is better in thermal conductiveness, which is preferable. On the other hand, industrial diamond is, though being low in purity, relatively inexpensive and can easily be utilized. In the production method of the composite material, even industrial diamond can be utilized as a raw material.

The content proportion of the diamond powder in the second mixed powder can be made to be, for example, 60% by volume or higher and 90% by volume or lower, or 70% by volume or higher and 90% by volume or lower. The content proportion of the copper powder in the second mixed powder can be made to be, for example, 10% by volume or higher and 40% by volume or lower, or 10% by volume or higher and 30% by volume or lower.

(Sintering Step)

Then, the second mixed powder is sintered under a high-temperature superhigh-pressure condition to thereby obtain the composite material. For example, first, the second mixed powder is packed in a molybdenum-made vessel, and pressed at a load of 2 t/cm$^2$ to make a green compact of 2 mm in thickness. A molybdenum-made lid is put on the vessel loaded with this green compact through a brazing filler metal, and the resultant is heated in vacuum to thereby braze and seal the vessel and the lid.

The above vessel is mounted in a belt-type superhigh pressure generator, and held under the condition of a pressure of 3 GPa and a temperature of 1,200° C. for 10 min, thereafter held, for 30 min, in a state that the temperature has been lowered to 500° C. while simultaneously the pressure is slowly reduced to the atmospheric pressure. Thereby, the mixed powder is sintered to thereby fabricate the composite material.

Embodiment 2: A Heat Sink

Figure 3:
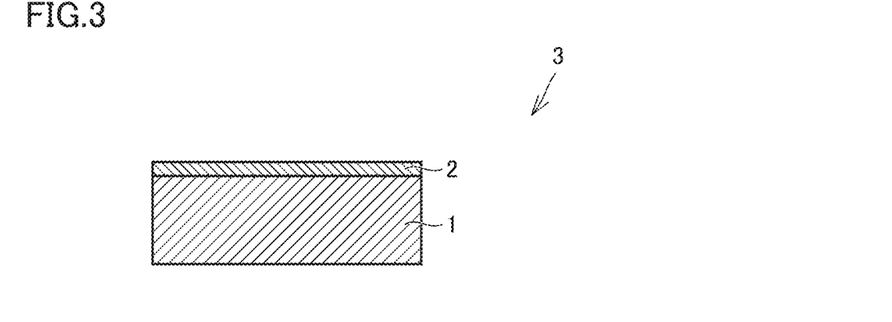
FIG. 3 is a view to interpret a typical constitution example of a heat sink according to an embodiment 2.

A heat sink of the present disclosure will be described by using FIG. 3. As shown in FIG. 3, a heat sink 3 contains a composite material 1 of the embodiment 1 and a metal plating layer 2 provided on at least a part of the surface of the composite material 1. The heat sink can have a high thermal conductivity and a high strength.

(Composite Material)

As composite material 1 contained in heat sink 3, the composite material described in the embodiment 1 can be used.

(Metal Plating Layer)

The heat sink, as shown in FIG. 3, contains metal plating layer 2 provided on at least a part of the surface of composite material 1. When the composite material has the metal plating layer, in the case where composite material 1 and a semiconductor element or the like are joined with a solder, a brazing filler metal or the like, the metal plating layer and metals of the solder, the brazing filler metal or the like are sufficiently wetted and the composite material and the semiconductor element or the like can be joined firmly.

The constituent metal of the metal plating layer suffices if being a metal which can withstand the working temperature of a solder or a brazing filler metal, and is not especially limited. Examples of the metal plating layer include nickel, copper, gold, zinc, tin, palladium and alloys of these elements. The metal plating layer can have, in addition to a single layer structure, a multilayer structure.

The metal plating layer having a smaller thickness is better, for the purpose of suppressing the reduction of the thermal conductiveness of the whole composite material. Specifically, the upper limit of the thickness (in the case of a multilayer structure, the total thickness) of the metal plating layer includes 300 μm or smaller, 200 μm or smaller or 100 μm or smaller. On the other hand, for the purpose of the above-mentioned use as a substrate for joining and the like, the lower limit of the thickness of the metal plating layer includes 0.1 μm or larger, 0.2 μm or larger or 0.5 μm or larger. The thickness of the metal plating layer can be made to be, for example, 0.1 μm or larger and 300 μm or smaller, 0.2 μm or larger and 200 μm or smaller, or 0.5 μm or larger and 100 μm or smaller.

(Method for Producing the Heat Sink)

A method for producing the heat sink of the embodiment 2 can have, for example, a step (hereinafter, referred to also as "composite material preparation step") of preparing the composite material of the embodiment 1, and a step (hereinafter, referred to also as "metal plating layer formation step") of carrying out a metal plating treatment on the composite material to form a metal plating layer on at least a part of the surface of the composite material to thereby obtain the heat sink. The detail of each step will be described below.

(Composite Material Preparation Step)

In the composite material preparation step, a composite material can be fabricated by using the same method as the production method of the composite material described in the embodiment 1. Since the specific method is described in the embodiment 1, the interpretation thereof will not be duplicated.

(Metal Plating Layer Formation Step)

Then, a metal plating treatment is carried out on the composite material to form a metal plating layer on at least a part of the surface of the composite material to thereby obtain the heat sink. The metal plating treatment can be carried out by a well-known method using a well-known metal plating solution.

The composite material of the present disclosure contains at least one first element selected from the group consisting of silicon, chromium, cobalt, nickel, molybdenum, titanium, vanadium, niobium, tantalum, tungsten and aluminum. These first elements are higher in the corrosion resistance than copper. Therefore, it is conceivable that in the composite material of the present disclosure, during a metal plating treatment, the corrosion of copper is suppressed by the metal plating solution. It is hence inferred that the composite material of the present disclosure can have a high thermal conductivity and a high strength also after the metal plating treatment.

Embodiment 3: A Semiconductor Device

Figure 4:
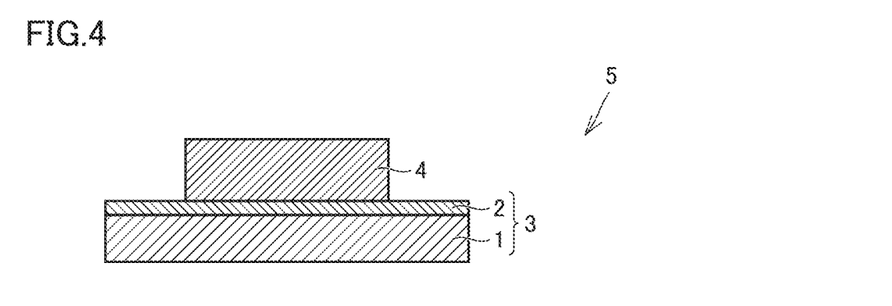
FIG. 4 is a view to interpret a typical constitution example of a semiconductor device according to an embodiment 3.

A semiconductor device of the present disclosure will be described by using FIG. 4. As shown in FIG. 4, a semiconductor device 5 comprises heat sink 3 described in the embodiment 2. In FIG. 4, a semiconductor element 4 is provided on heat sink 3 to constitute semiconductor device 5. The semiconductor device can maintain an excellent performance and simultaneously can have a long service life.

EXAMPLES

The present embodiments will be described more specifically by way of Examples. The present embodiments are not any more limited to these Examples.

[Sample 1-1 to Sample 1-8, Sample 2-1 to Sample 2-8, Sample 3-1 to Sample 3-8, and Sample 4-1 to Sample 4-10]

<Fabrication of Composite Materials>

(First Mixed Powder Preparation Step)

For each Sample, a copper powder (average particle diameter: 5 μm, purity: 99.99%) and a first element powder (for example, for Sample 1-1, a Si (silicon) powder) of a kind described in the "Kind of first element" column of the "First mixed powder" in Table 1 to Table 4 were mixed to thereby obtain a first mixed powder. The content rate of the first element powder in the first mixed powder was set to be an amount (for example, in Sample 1-1, 55 ppm) described in the "Content rate of first element (ppm)" column of the "First mixed powder" in Table 1 to Table 4.

(Second Mixed Powder Preparation Step)

Then, the first mixed powder and a diamond powder were mixed so that the respective content proportions in a second mixed powder became proportions described in the "Diamond powder (% by volume)" column and the "First mixed powder (copper powder)(% by volume)" column of the "Second mixed powder" in Table 1 to Table 4, to thereby obtain the second mixed powder (for example, in Sample 1-1, the diamond powder and the first mixed powder were mixed in respective proportions of 72% by volume and 28% by volume). Here, although the first element powder was contained in the first mixed powder, since the first element powder was minute, the first element powder was not taken into consideration as a volumetric proportion.

(Sintering Step)

Then, the second mixed powder was packed in a molybdenum-made vessel of 25 mm in inner diameter and 5 mm in depth, and pressed at a load of 2 t/cm$^2$ to make a green compact of 2 mm in thickness. A molybdenum-made lid was put on the vessel loaded with the green compact through a brazing filler metal, and the resultant was heated in vacuum to thereby braze and seal the vessel and the lid.

The vessel was mounted in a belt-type superhigh pressure generator, and held under the condition of a pressure of 3 GPa and a temperature of 1,200° C. for 5 min, thereafter held, for 30 min, in a state that the temperature had been lowered to 500° C. while simultaneously the pressure was slowly reduced to the atmospheric pressure. The upper and lower sides of the recovered molybdenum vessel were ground by a surface grinder to thereby obtain a compact.

The compact was cut out into a plate shape having a size of ϕ50 mm×2 mm by a wire electrodischarge machining, and the surfaces were ground by a double side grinding machine. Further, the resultant was cut into a piece of a size of 15 mm×1 mm×2 mm by the wire electrodischarge machining. Thereby, a piece composed of a composite material of each sample was obtained.

<Fabrication of Heat Sinks>

(Metal Plating Layer Formation Step)

A nickel electroplating treatment was carried out on the piece composed of a composite material of each sample to form a nickel layer (metal plating layer) of 3 μm in thickness on the whole surface of the piece to thereby obtain a heat sink of each sample. A plating solution used was a WATT bath (composition: 250 g/L of nickel sulfate, 60 g/L of nickel chloride, 40 mL/L of boric acid).

TABLE 1

| Sample No. | First mixed powder Kind of first element | First mixed powder Content rate of first element (ppm) | Second mixed powder Diamond powder (% by volume) | Second mixed powder First mixed powder (Copper powder) (% by volume) | Composite material Diamond particle (% by volume) | Composite material Copper (% by volume) | Composite material Content rate of first element based on total mass of copper and first element (ppm) | Concentrating of first element | Thermal expansion coefficient (ppm/K) | Heat sink Strength (MPa) | Heat sink Thermal conductivity (W/mK) |
|---|---|---|---|---|---|---|---|---|---|---|---|
| 1-1 | Si | 55 | 72 | 28 | 72 | 28 | 52 | present | 5.94 | 119 | 441 |
| 1-2 | Si | 205 | 72 | 28 | 72 | 28 | 202 | present | 5.93 | 128 | 494 |
| 1-3 | Si | 502 | 72 | 28 | 72 | 28 | 496 | present | 5.96 | 137 | 505 |
| 1-4 | Si | 808 | 72 | 28 | 72 | 28 | 798 | present | 5.95 | 153 | 511 |
| 1-5 | Si | 998 | 72 | 28 | 72 | 28 | 997 | present | 5.92 | 158 | 483 |
| 1-6 | Si | 2010 | 72 | 28 | 72 | 28 | 1996 | present | 5.92 | 161 | 457 |
| 1-7 | Si | 2535 | 72 | 28 | 72 | 28 | 2513 | present | 5.91 | 163 | 425 |
| 1-8 | Si | 6 | 72 | 28 | 72 | 28 | 5 | absent | 5.95 | 106 | 405 |

TABLE 2

| Sample No. | First mixed powder Kind of first element | First mixed powder Content rate of first element (ppm) | Second mixed powder Diamond powder (% by volume) | Second mixed powder First mixed powder (Copper powder) (% by volume) | Composite material Diamond particle (% by volume) | Composite material Copper (% by volume) | Composite material Content rate of first element based on total mass of copper and first element (ppm) | Concentrating of first element | Thermal expansion coefficient (ppm/K) | Heat sink Strength (MPa) | Heat sink Thermal conductivity (W/mK) |
|---|---|---|---|---|---|---|---|---|---|---|---|
| 2-1 | Cr | 56 | 72 | 28 | 72 | 28 | 53 | present | 6.01 | 119 | 458 |
| 2-2 | Cr | 209 | 72 | 28 | 72 | 28 | 203 | present | 5.98 | 139 | 502 |
| 2-3 | Cr | 502 | 72 | 28 | 72 | 28 | 495 | present | 5.99 | 163 | 525 |
| 2-4 | Cr | 803 | 72 | 28 | 72 | 28 | 796 | present | 5.92 | 178 | 529 |
| 2-5 | Cr | 1007 | 72 | 28 | 72 | 28 | 998 | present | 5.93 | 179 | 494 |
| 2-6 | Cr | 2013 | 72 | 28 | 72 | 28 | 1998 | present | 5.97 | 186 | 451 |
| 2-7 | Cr | 2522 | 72 | 28 | 72 | 28 | 2512 | present | 5.94 | 187 | 432 |
| 2-8 | Cr | 19 | 72 | 28 | 72 | 28 | 17 | absent | 5.95 | 111 | 405 |

TABLE 3

| Sample No. | First mixed powder Kind of first element | First mixed powder Content rate of first element (ppm) | Second mixed powder Diamond powder (% by volume) | Second mixed powder First mixed powder (Copper powder) (% by volume) | Composite material Diamond particle (% by volume) | Composite material Copper (% by volume) | Composite material Content rate of first element based on total mass of copper and first element (ppm) | Concentrating of first element | Thermal expansion coefficient ppm/K | Heat sink Strength (MPa) | Heat sink Thermal conductivity (W/mK) |
|---|---|---|---|---|---|---|---|---|---|---|---|
| 3-1 | Co | 53 | 72 | 28 | 72 | 28 | 55 | present | 5.97 | 116 | 460 |
| 3-2 | Co | 205 | 72 | 28 | 72 | 28 | 214 | present | 5.99 | 135 | 490 |
| 3-3 | Co | 506 | 72 | 28 | 72 | 28 | 486 | present | 6.01 | 161 | 506 |
| 3-4 | Co | 807 | 72 | 28 | 72 | 28 | 770 | present | 5.94 | 175 | 501 |
| 3-5 | Co | 1005 | 72 | 28 | 72 | 28 | 982 | present | 6.03 | 176 | 485 |
| 3-6 | Co | 1997 | 72 | 28 | 72 | 28 | 1992 | present | 6.02 | 179 | 478 |

TABLE 3-continued

| | First mixed powder | | Second mixed powder | | Composite material | | | | | Heat sink | |
|---|---|---|---|---|---|---|---|---|---|---|---|
| Sample No. | Kind of first element | Content rate of first element (ppm) | Diamond powder (% by volume) | First mixed powder (Copper powder) (% by volume) | Diamond particle (% by volume) | Copper (% by volume) | Content rate of first element based on total mass of copper and first element (ppm) | Concentrating of first element | Thermal expansion coefficient ppm/K | Strength (MPa) | Thermal conductivity (W/mK) |
| 3-7 | Co | 2500 | 72 | 28 | 72 | 28 | 2590 | present | 5.94 | 182 | 428 |
| 3-8 | Co | 8 | 72 | 28 | 72 | 28 | 7 | absent | 5.96 | 111 | 405 |

TABLE 4

| | First mixed powder | | Second mixed powder | | Composite material | | | | | Heat sink | |
|---|---|---|---|---|---|---|---|---|---|---|---|
| Sample No. | Kind of first element | Content rate of first element (ppm) | Diamond powder (% by volume) | First mixed powder (Copper powder) (% by volume) | Diamond particle (% by volume) | Copper (% by volume) | Content rate of first element based on total mass of copper and first element (ppm) | Concentrating of first element | Thermal expansion coefficient ppm/K | Strength (MPa) | Thermal conductivity (W/mK) |
| 4-1 | Ni | 502 | 72 | 28 | 72 | 28 | 505 | present | 5.95 | 154 | 492 |
| 4-2 | Mo | 504 | 72 | 28 | 72 | 28 | 491 | present | 6.02 | 150 | 488 |
| 4-3 | Ti | 496 | 72 | 28 | 72 | 28 | 493 | present | 5.96 | 161 | 505 |
| 4-4 | V | 494 | 72 | 28 | 72 | 28 | 496 | present | 5.99 | 163 | 503 |
| 4-5 | Nb | 502 | 72 | 28 | 72 | 28 | 502 | present | 6.01 | 150 | 513 |
| 4-6 | Ta | 497 | 72 | 28 | 72 | 28 | 496 | present | 5.92 | 161 | 509 |
| 4-7 | W | 495 | 72 | 28 | 72 | 28 | 508 | present | 5.99 | 149 | 493 |
| 4-8 | Ti | 504 | 62 | 38 | 62 | 38 | 498 | present | 6.52 | 144 | 498 |
| 4-9 | Ti | 503 | 80 | 20 | 80 | 20 | 501 | present | 5.13 | 163 | 607 |
| 4-10 | Ti | 498 | 89 | 11 | 89 | 11 | 494 | present | 5.06 | 173 | 618 |

<Evaluations>
(Compositions of the Composite Materials)

For the piece composed of a composite material of each sample, there were measured the content rate of the diamond particles, and the content rate of the copper. Since a specific measuring method was the same as in the embodiment 1, the interpretation thereof will not be duplicated. The results are shown in the "Diamond particle (% by volume)" column and the "Copper (% by volume)" column of the "Composite material" in Table 1 to Table 4.

(Content Rate of the First Element Based on the Total Mass of Copper and the First Element)

For the piece composed of a composite material of each sample, there was measured the content rate of the first element based on the total mass of copper and the first element. Since a specific measuring method was the same as in the embodiment 1, the interpretation thereof will not be duplicated. The results are shown in the "Content rate of first element to total mass of copper and first element (ppm)" column of the "Composite material" in Table 1 to Table 4.

(Concentrating of the First Element)

For the piece composed of a composite material of each sample, there was confirmed the presence/absence of concentrating of the first element at the interface between the diamond particle and the copper. Since a specific measuring method was the same as in the embodiment 1, the interpretation thereof will not be duplicated. The results are shown in the "Concentrating of first element" column of the "Composite material" in Table 1 to Table 4. The case where concentrating of the first element was confirmed is described as "present" and the case where concentrating of the first element was not confirmed is described as "absent".

(Thermal Expansion Coefficient)

For the piece composed of a composite material of each sample, the thermal expansion coefficient was measured by thermomechanical analysis (measuring instrument: "TMA-60D"(R), manufactured by Shimadzu Corp.). The results are shown in the "Thermal expansion coefficient (ppm/K)" column of the "Composite material" in Table 1 to Table 4.

(Strength)

Figure 5:
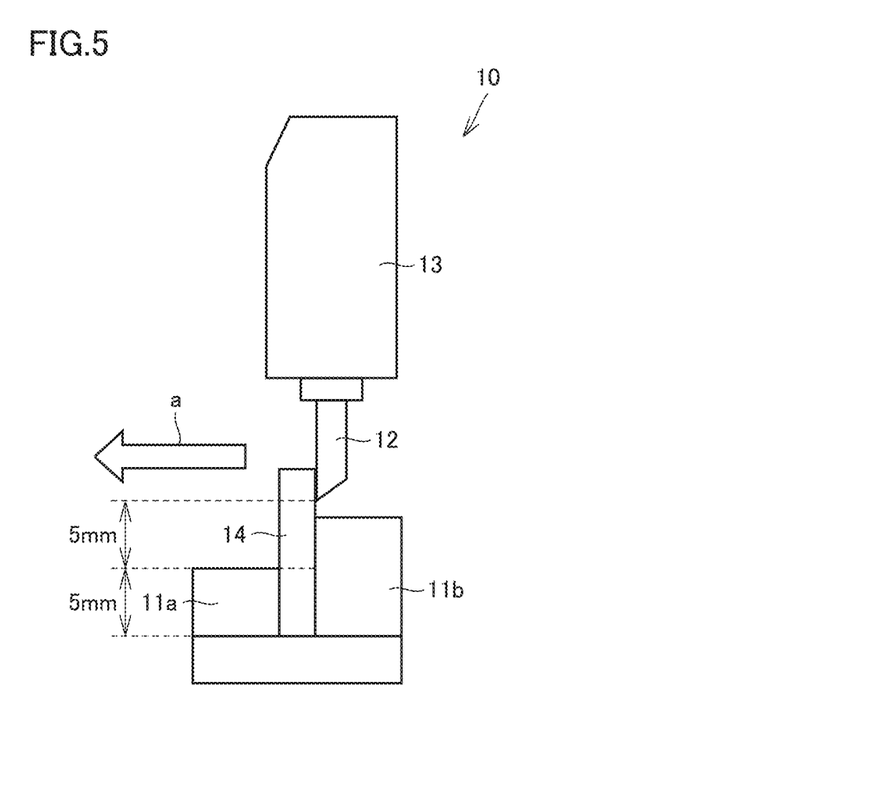
FIG. 5 is a view showing a shear tester.

For the heat sink of each sample, the strength was measured by using a shear tester 10 illustrated in FIG. 5. A test piece 14 composed of the heat sink of each sample was fixed between a first fixing block 11a and a second fixing block 11b of shear tester 10. The test piece was fixed to the position of 5 mm in height thereof by first fixing block 11a and second fixing block 11*b*. A terminal 12 was arranged at the position of 5 mm in the protruding height from fixing block 11*a*; and a load was applied in the direction indicated by an arrow a and the load when the test piece was broken was measured by a load sensor 13. The load corresponded to the strength. The results are shown in the "Strength (MPa)" column of the "Heat sink" in Table 1 to Table 4.

(Thermal Conductivity)

For the heat sink of each sample, the thermal conductivity was measured by a laser flash method (measuring instrument: "LFA467"(R), manufactured by NETZSCH GmbH). The results are shown in the "Thermal conductivity (W/mK)" column of the "Heat sink" in Table 1 to Table 4.

<Consideration>

Sample 1-1 to Sample 1-6, Sample 2-1 to Sample 2-6, Sample 3-1 to Sample 3-6 and Sample 4-1 to Sample 4-10 corresponded to Examples.

Sample 1-7 and Sample 2-7, in which the content rate of the first element based on the total mass of copper and the first element was higher than 2,000 ppm, corresponded to Comparative Examples.

Sample 1-8 and Sample 2-8, in which the content rate of the first element based on the total mass of copper and the first element was lower than 50 ppm, corresponded to Comparative Examples.

It is confirmed that Sample 1-1 to Sample 1-6, Sample 2-1 to Sample 2-6, Sample 3-1 to Sample 3-6 and Sample 4-1 to Sample 4-10 (Examples) had a strength equal to or higher than and a thermal conductivity higher than those of Sample 1-7, Sample 1-8, Sample 2-7 and Sample 2-8 (Comparative Examples).

Here, although it is confirmed that the above Examples had a high thermal conductivity and a high strength, in particular, also after the nickel electroplating treatment out of metal plating treatment, the kind of metal plating treatment is not limited to the nickel electroplating treatment. The composite material of the present disclosure can have a high thermal conductivity and a high strength, also after an electroplating treatment of another kind.

Embodiments and Examples of the present disclosure have been described hitherto, but suitable combinations and various modifications of constitutions of the above-mentioned embodiments and Examples have been predetermined since from the first.

The embodiments and Examples disclosed this time are exemplifications in every respect, and should be understood not to be restrictive. The scope of the present invention is indicated not by the above-mentioned embodiments and Examples but by the claims, and is intended to include any modifications within the meaning and range equivalent to the claims.

REFERENCE SIGNS LIST

1 composite material, 2 metal plating layer, 3 heat sink, 4 semiconductor element, 5 semiconductor device, 10 shear tester, 11*a* first fixing block, 11*b* second fixing block, 12 terminal, 13 load sensor, 14 test piece, a direction of load

The invention claimed is:

1. A composite material, comprising:
   a plurality of diamond particles;
   copper; and
   at least one first element selected from the group consisting of silicon, chromium, cobalt, nickel, molybdenum, titanium, vanadium, niobium, tantalum and tungsten,
   wherein a content rate of the first element based on the total mass of the copper and the first element is 150 ppm or higher and 1,998 ppm or lower.

2. The composite material according to claim 1, wherein the composite material comprises 60% by volume or higher and 90% by volume or lower of the diamond particles and 10% by volume or higher and 40% by volume or lower of the copper.

3. The composite material according to claim 1, wherein the content rate of the first element based on the total mass of the copper and the first element is 200 ppm or higher and 800 ppm or lower.

4. The composite material according to claim 1, wherein the first element is concentrated at interfaces between the diamond particles and the copper.

5. A heat sink, comprising:
   the composite material according to claim 1; and
   a metal plating layer provided on at least a part of the surface of the composite material.

6. A semiconductor device, comprising the heat sink according to claim 5.

* * * * *